United States Patent
Sandström

(10) Patent No.: US 8,472,089 B2
(45) Date of Patent: Jun. 25, 2013

(54) ROTOR IMAGING SYSTEM AND METHOD WITH VARIABLE-RATE PIXEL CLOCK

(75) Inventor: Torbjörn Sandström, Pixbo (SE)

(73) Assignee: Micronic Laser Systems (SE)

( * ) Notice: Subject to any disclaimer, the term of this patent is extended or adjusted under 35 U.S.C. 154(b) by 89 days.

(21) Appl. No.: 12/718,895

(22) Filed: Mar. 5, 2010

(65) Prior Publication Data

US 2010/0225979 A1     Sep. 9, 2010

Related U.S. Application Data

(60) Provisional application No. 61/158,310, filed on Mar. 6, 2009.

(51) Int. Cl.
*H04N 1/04* (2006.01)
(52) U.S. Cl.
USPC ............ 358/474; 358/493; 358/482; 382/100
(58) Field of Classification Search
USPC ... 358/474, 1.9, 497, 493, 482, 483; 382/100, 382/167, 284; 359/290, 292, 291; 347/239, 347/255; 438/25, 26
See application file for complete search history.

(56) References Cited

U.S. PATENT DOCUMENTS

| | | | | |
|---|---|---|---|---|
| 2,894,066 A | * | 7/1959 | Buckingham et al. | 358/497 |
| 2,978,535 A | * | 4/1961 | Brown | 348/440.1 |
| 3,335,413 A | * | 8/1967 | Glenn, Jr. | 365/126 |
| 4,250,873 A | * | 2/1981 | Bonnet | 600/104 |
| 4,853,710 A | * | 8/1989 | Shimada et al. | 347/261 |
| 5,043,827 A | * | 8/1991 | Beikirch | 382/300 |
| 5,289,231 A | | 2/1994 | Magome et al. | |
| 5,416,611 A | * | 5/1995 | Tandon | 358/474 |
| 5,815,303 A | * | 9/1998 | Berlin | 359/196.1 |
| 6,421,076 B1 | * | 7/2002 | Asaya | 347/234 |
| 6,572,549 B1 | * | 6/2003 | Jong et al. | 600/443 |
| 6,700,131 B2 | * | 3/2004 | Nishihara et al. | 250/586 |
| 7,633,656 B2 | * | 12/2009 | Miyahara | 358/474 |
| 2007/0188591 A1 | | 8/2007 | Sandstrom | |

FOREIGN PATENT DOCUMENTS

GB    2 185 167 A    7/1987
WO    00/57629 A1   9/2000

OTHER PUBLICATIONS

International Search Report and Written Opinion, Application No. PCT/EP2010/052861, mailed Aug. 26, 2010.
International Search Report and Written Opinion, Application No. PCT/EP2010/052864, mailed Aug. 26, 2010.

* cited by examiner

*Primary Examiner* — Negussie Worku
(74) *Attorney, Agent, or Firm* — Haynes Beffel & Wolfeld LLP; Ernest J. Beffel, Jr.

(57) ABSTRACT

The technology disclosed relates to handling varying pixel overlaps long a first axis as a scanning head sweeps a curved path that is not parallel to the first axis. In particular, we teach use of a variable frequency pixel clock to produce equally spaced pixels along the first axis as a rotor arm scans a curved path that is not parallel to the first axis. The pixel clock has a varying frequency that varies approximately sinusoidally with the position of the scanning head relative to the first axis.

18 Claims, 3 Drawing Sheets

Relative clock = |Sine beta|
90 = 1.00
75 = .996
60 = .866
45 = .707

ROTOR IMAGING SYSTEM AND METHOD WITH VARIABLE-RATE PIXEL CLOCK

RELATED APPLICATION

This application claims the benefit of U.S. Provisional Application No. 61/158,310, filed 6 Mar. 2009, which is hereby incorporated by reference.

This application is related to U.S. patent application Ser. No. 12/718,883, filed 5 March 2010 entitled "Rotor Optics Imaging Method and System with Variable Dose During Sweep"; and U.S. patent application Ser. No. 12/718,900, filed 5 Mar. 2010 entitled "Variable Overlap Method and Device for Stitching Together Lithographic Stripes" which issues as U.S. Pat. No. 8,312,393 on 13 Dec. 2012; and U.S. patent application Ser. No. 12/718,903, filed 5 Mar. 2013 entitled "Lithographic Printing System with Placement Corrections"; all filed contemporaneously. The related applications are incorporated by reference.

This application is also related to U.S. patent application Ser. No. 12/706,624, entitled "Improved SLM Device and Method", filed 16 Feb. 2010. The related application is incorporated by reference.

BACKGROUND OF THE INVENTION

The technology disclosed relates to handling varying pixel overlaps along a first axis as a scanning head sweeps a curved path that is not parallel to the first axis. In particular, we teach use of a variable frequency pixel clock to produce equally spaced pixels along the first axis as a rotor arm scans a curved path that is not parallel to the first axis. The pixel clock has a varying frequency that varies approximately sinusoidally with the position of the scanning head relative to the first axis.

This design team recently has described in patent applications of rotor arm scanning system with very high throughput. The rotor arm scanner can, for instance, be used to write directly to large area masks.

The use of the rotor arm for scanning, instead of a shuttlecock with a reciprocating motion or a fixed head and a moving bed, is a radical departure from standard lithographic and imaging equipment. Use of the rotor presents very challenging data path issues, as the data is presented in a Cartesian grid that requires translation or mapping for use in a polar scanning system, in which the actual scanning path also involves linear motion of the workpiece as the scanning arm rotates.

Accordingly, many new components of a data path need to be developed. Many new problems not presented by prior lithographic technologies need to be identified and solved. Resolution of the many constituent engineering challenges has the potential of contributing to an overall system that has many times the pixel and area coverage throughput of prior, reciprocating systems.

SUMMARY OF THE INVENTION

The technology disclosed relates to handling varying pixel overlaps long a first axis as a scanning head sweeps a curved path that is not parallel to the first axis. In particular, we teach use of a variable frequency pixel clock to produce equally spaced pixels along the first axis as a rotor arm scans a curved path that is not parallel to the first axis. The pixel clock has a varying frequency that varies approximately sinusoidally with the position of the scanning head relative to the first axis. Particular aspects of the present invention are described in the claims, specification and drawings.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Variable-Rate Pixel Clock

Figure 3:
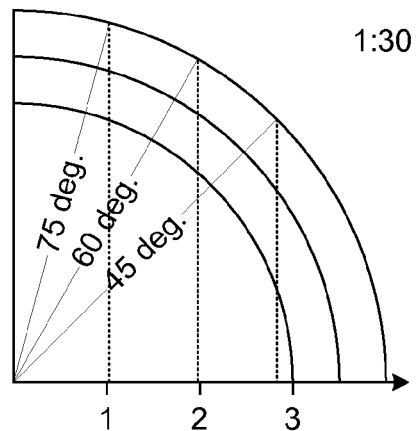
FIG. 3 depicts varying overlap of pixels in time or a scanning head sweep an arc.

A rotary printer has varying rates of traverse across x and y axes of a Cartesian graph, generally described by r sine θ and r cosine θ. Transformation or mapping of rasterized data from a Cartesian coordinate system to signals that drive a modulator as it sweeps an arc can be simplified by using a variable rate pixel clock that divides the sweep of the printing head into equal width segments, along a Cartesian axis generally aligned with the sweep of the rotor. If a 90 degree of sweep is used for printing, the relative length of time between successive pixel clocks will range between about 0.7 and 1.0 units in a constant time frame of reference, as depicted in FIG. 3. The varying pixel clock can be used for reloading the modulator. Data preparation can be driven off the variable clock or prepared, buffered and loaded into the variable clock portion of a system as required. Driving the modulator at intervals that correspond to pixels in a regular Cartesian rasterization is an alternative to driving the modulator on constant clock with a varying transit at a rate through the Cartesian system.

A variable rate pixel clock can be used, such as a digitally synthesized frame (and MUX) clock, at no cost in data volume.

Figure 4:
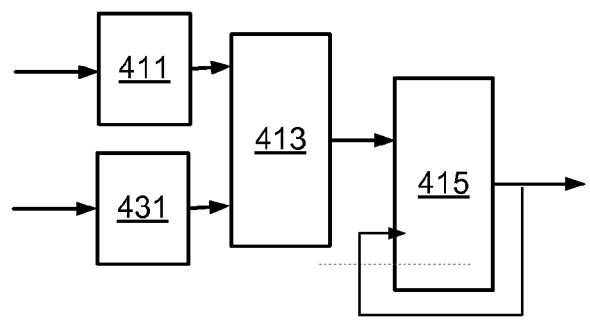
FIG. 4 illustrates a varying clock which can be implemented as a low-frequency direct digital synthesizer.

Using a variable pixel clock produces a constant grid for rendering, resampling, biasing etc., and a constant grid for writing. FIG. 4 illustrates a varying clock that can be implemented as a low-frequency direct digital synthesizer (DDS). It is started at start-of-sweep and accumulates an increment until overflow, then it signals a clock tick. The increment is typically an integer that is loaded from memory which relates to the varying frequency. The clock phase is the result of an integration and will be a smooth function even if the frequency is changed abruptly. The position error can be added to the frequency read from the memory. If a number, say 54, is added to the DDS clock repeatedly over 10,000 clock cycles, the pattern smoothly stretches by 540,000 units over 300 microns travel (assuming a 100 MHz DDS clock).

FIG. 4 is a high level schematic diagram of a pixel clock generator with inputs for MUX and correction delays. With a high clock rate adder, the two inputs 411, 431 could be MUXed 413 and handled by alternate accumulator 415 operations. With this pixel clock generator running at a suitably high speed, such as 100 or 200 MHz, the overflow of the accumulator 415 would serve as a pixel clock signal. Alternative variable clock designs are, of course, available with varying complexity and jitter. In this application, the clock jitter is not highly critical, so a simple design as depicted is expected to function satisfactorily.

System complexity for a rotor system could be reduced if interpolation or resampling in the scanning direction were not needed, as described in a companion application referenced above. The interpolation or resampling would then only be used along the SLM, to fit the rendered data to the pixels. A varying clock can produce constant width pixels that are coincident with the rasterized data to be printed. This would avoid interpolation or resampling along the scanning direction.

In one dimension, there is little difference between resampling and interpolation. Resampling may be seen as one particular form of interpolation ("linear", "cubic", etc.). The one-dimensional resampling may be expressed in a simple, explicit formula. It will be confused by two-dimensional patterns, but with a conservative pixel size the consequences will be limited.

Delay While Loading the SLM

The sequential loading of data into the SLM pixels by the data MUX gives a staggered line. If the pixels are not too big, it is possible to load the pixels in a non-sequential sequence (semi-random), which makes the time average of every group of three pixels more or less the same. The individual pixels are not resolved and a large delay compensates for a small delay in the pixel beside it. The semi-random order of loading can be by an exhaustive search, taking into account the fuzziness of the optical system. Probably a 1 to 8 unit (+/−4) delay variation can be reduced to +/−1.5 or so by psuedo-random load sequencing.

Figure 5:
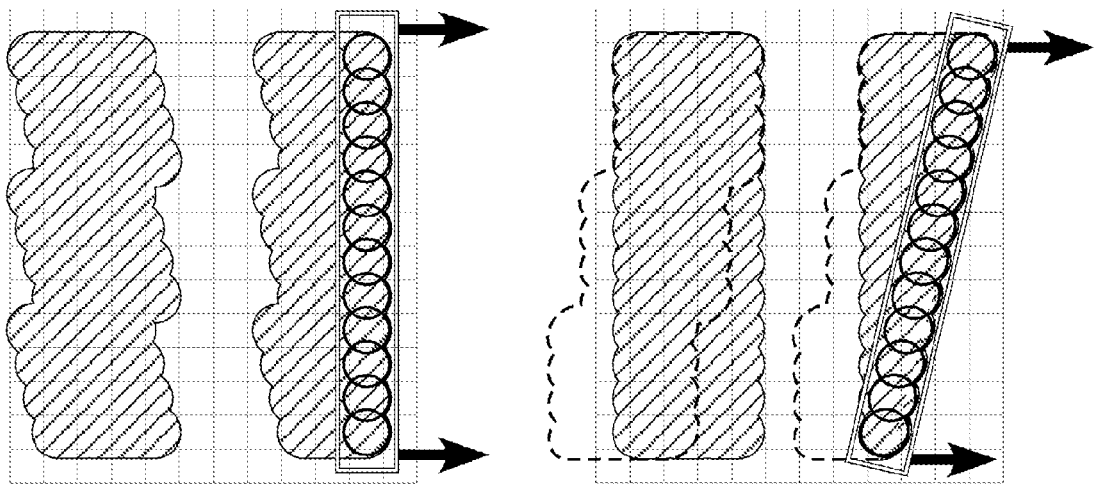
FIG. 5 depicts loading the pixels sequentially and turning the SLM to compensate for systematic delay.

Alternatively, one can remove the varying delays by: loading the pixels sequentially and turning the SLM to compensate for systematic delay, as depicted in FIG. 5. Each DAC will be displaced by one unit in x and the angle is arctan(1/mux_factor). The angle is so large (typically 0.0625 or 0.125 radians) that the magnification needs to be adjusted for the sine of the angle as well.

There is a similar azimuth in y, namely from the finite rotation speed and continuous movement of the stage. The written path on the substrate differs from the path of the lens by an azimuth angle, but the azimuth angle varies with the angle. It should be no real problem, since once the interpolation/resampling in y is implemented it is just a matter of book-keeping to send the data to the right y coordinate. The electronic range of correction and the assymmetry can be reduced if the rotation axis is placed slightly to the side of the of the center of the workpiece.

Common Rotor Optics

Environments in which the technology disclosed is particularly useful include a rotating arm printing or viewing device with relay optics with a hub at one end of the arm and optics at the other end, which couple image information with the surface of a workpiece. The optical coupling at the hub may be either on or off the axis of rotation. The following section provides background on the inventive rotor system that is useful for understanding the role of a variable dose or dose compensation function.

A rotor arm system can write to (or read from) a workpiece. It uses a stationary optical image device to modulate (or collect) relayed image information. It relays the image information along optics of at least one rotating arm between the stationary optical image device and a surface of the workpiece. By repeatedly sweeping a curved stripe across the surface of the workpiece, a contiguous image may be written from overlapping partial images by stitching together the partial images on the workpiece.

Pattern information, e.g., a partial image, is relayed between the optical image device and the surface of the workpiece with a substantially constant azimuthal orientation. By "substantially constant," we include a small rotation that is within tolerances or that is corrected in rasterizing, producing no more than a 0.5 degree rotational variation in the angular relationship when the relayed versions are separated by more than 5 degrees sweep of the rotating optical arm.

The rotor can have several arms, e.g. 2, 3, 4, 6, or 8 arms, thereby multiplying the scanned surface area per time unit. Heavy, complex, fragile machine parts, or parts that are expensive or need many connections and services can be placed stationary near the center or hub of the rotor and be shared by the multiple arms. An image is relayed between a stationary image device placed at or near the hub of the rotor and the workpiece, through the radial arm.

The rotor system is described by reference to relay optics because it can be used to write to or read from a workpiece. For instance, it is useful to write directly to a large area mask or a PCB. Or, it can be used to inspect a large area mask. It is used with a workpiece positioning mechanism, such as a stage, details of which are outside the scope of this disclosure.

Figure 1:
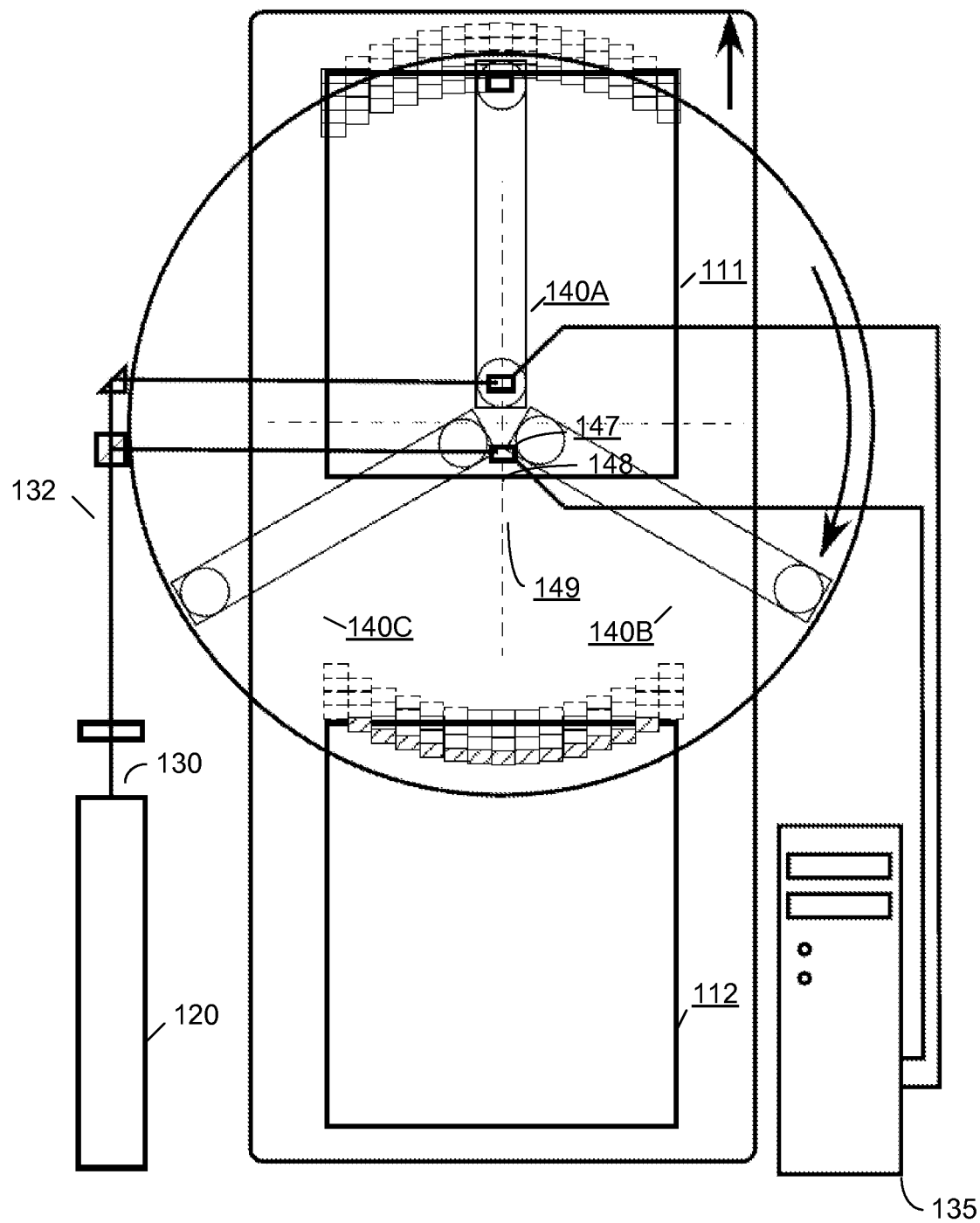
FIG. 1 depicts a scanning system with three arms and a pair of workpieces 111, 112 being written on opposite sides of the hub 148.

FIG. 1 depicts a rotor scanning system with three arms and a pair of workpieces 111, 112 being written on opposite sides of the hub 148. This system may have a duty cycle of 100%. Each rotor writes through an arc of 60 degrees. Only one arm 140 writes at a time, alternatively on the two workpieces 111 and 112. The laser energy is switched by polarization control 132 between the two SLMs 147 and 149, and the data stream is also switched between the SLMs. Since the laser 120 and the data path 135 are among the most expensive modules in a writing machines, this embodiment has been designed to use laser and data channel 100% of the time while the SLMs and the optics in the arms has lower duty cycles, 50% and 33% respectively. This may be, for instance, an example of a writing system with three rotating arms 140A-C. There are a variety of alternative designs for these arms and the relay optics. The figure conceptually depicts a laser 120 and a controller 135 sending data to two SLMs 130 which are relayed 132, 147, 149 to the rotating arms. It shows how each arm moves in front of each SLM and writes a series of concentric stamps on the workpieces 111, 112. While two workpieces are shown in this figure, more workpieces could be positioned under a rotor, depending on its size. While the example is described as a writing system, the direction of relay could just as easily be from the workpiece back to a pair of detectors positioned where the laser 120 is and elsewhere. In alternative configurations, one workpiece might be used; four arms might be used.

Some particularly useful applications of this technology involve writing patterns on electronic substrates, such as: wafers' front and back sides; PCBs; build-up, interposer and flexible interconnection substrates; and masks, stencils, templates and other masters. Likewise, the rotor writer can be used for patterning panels in displays, electronic paper, plastic logic and photovoltaic cells. The patterning can be done by exposure of photoresist, but also through other actions of light such as thermal or photochemical processes: melting, evaporation, ablation, thermal fusing, laser-induced pattern transfer, annealing, pyrolytic and photo induced etching and deposition.

A rotor system replaces the customary motion of a Cartesian flatbed xy stage with a polar scanning motion. Potential benefits include high throughput, low cost and mechanical simplicity. The scanning action is done by a rotating motion, which is mechanically easier to build to high accuracy than straight-line motion. The position accuracy of a point on the periphery of the rotor is determined by the quality of a bearing and the accuracy of an angle encoder. Both of these components can be sourced with high quality. A rotational reduces vibrations and transient forces during scanning and between scanning strokes. A well-balanced rotor emits essentially no vibrations or reactive forces to the supporting structure, while reciprocating straight movements need to reverse their momentum twice per stroke and create strong disturbances when doing so. A rotor may have a higher scanning velocity with less mechanical overhead. A rotor with several arms uses nearly the whole circle for writing. For instance, a rotor with four arms may scan through an 80 degree arc. Out of the 360 degrees in a circle, the rotor scans during 4×80=320 degrees. A reciprocating movement needs more mechanical overhead. The overhead for reciprocating movement gets larger with increased scanning velocity.

Rotor systems may have a very high data rate and throughput and may be used for other types of patterning where these characteristics are useful: photo-setting, printing, engraving, security marking, etc. The rotor has a smooth movement and small mechanical overhead even at high rotation speeds, e.g. 60, 120, 300, 600 r.p.m. or higher. The scanning speed, which is the peripheral speed of the rotor, may be higher than comparable reciprocating systems, e.g. 2, 4, 8, 20 m/s or higher.

In practical terms, one implementation would have a rotor one meter in diameter, spinning 3.3 turns per second with a centripetal acceleration of 20 g. The acceleration force gives a constant force on rotating components, such that a lens weighing 50 grams will feel a constant force outwards of 10 N. With four arms and rotational speed, the system writes 13 strokes per second with a peripheral velocity of 10 m/s, a mechanical speed that is impractical with a reciprocating stage. Furthermore, with proper balancing and design of the bearings the motion will be smooth, have high mechanical precision and need little power to be sustained. If the image generator is a micromechanical 1D SLM with constant 2 MHz frame rate used for creating a 1D partial image on the workpiece, the reloading of the SLM would occur every 5 microns along the scanning direction and the pixel size could be 5×5 microns, allowing line width of less than 15 microns to be written. With a micromechanical 1D SLM, effectively having 8000×1 pixels, each stroke would fill a stripe 40 mm wide with pattern, and cover—with some reduction for the non-straight scan—0.3 square meters per second or 20 square meters per minute. This is a very high coverage rate, compared to other writing technologies.

Figure 2:
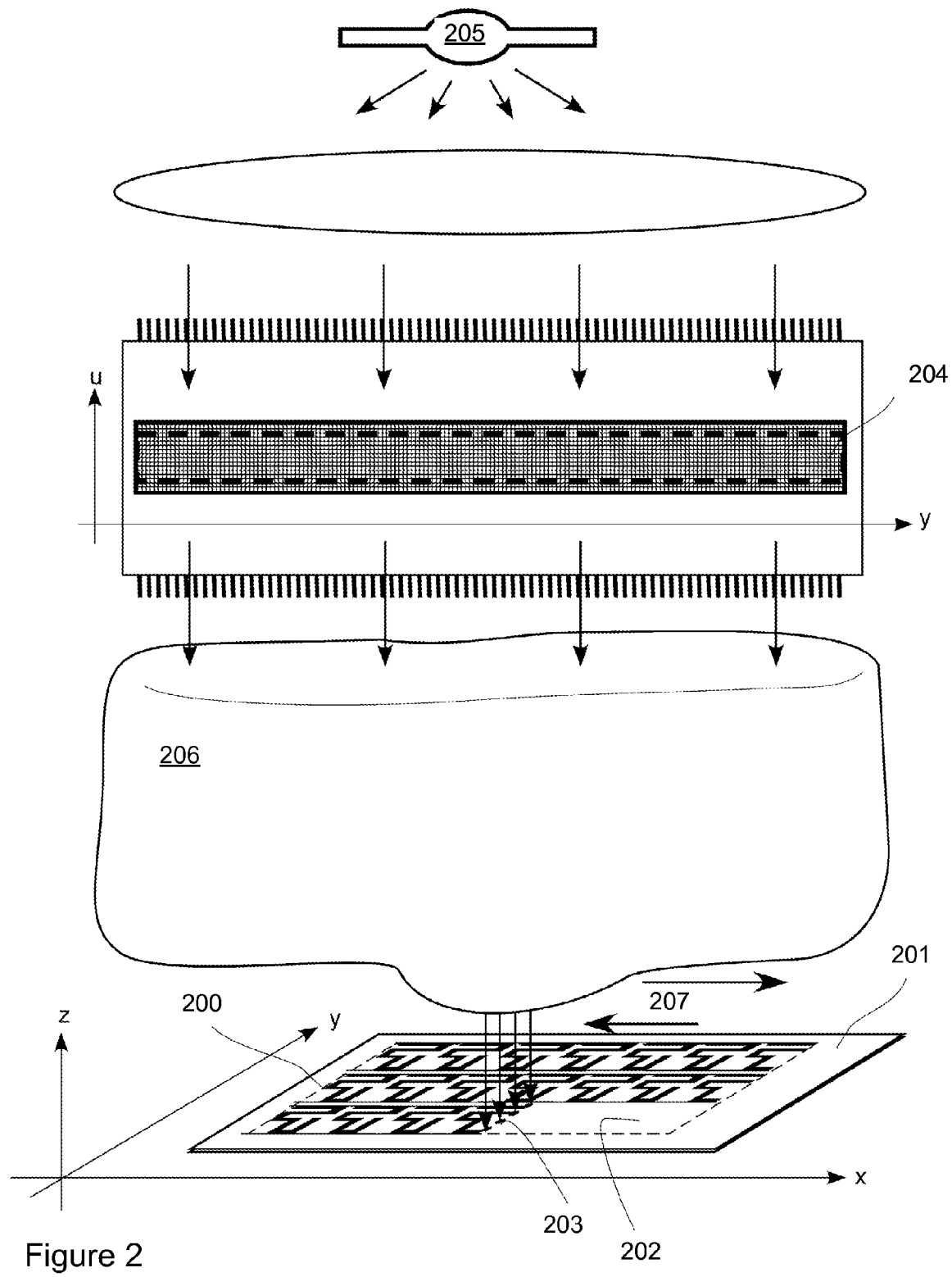
FIG. 2 further describes use of a so-called one-dimensional SLM with anamorphic optics.

FIG. 2 further describes use of a so-called one-dimensional SLM with anamorphic optics. A light source 205 (arc lamp, gas discharge, laser, array of lasers, laser plasma, LED, array of LEDs etc.) illuminates a one-dimensional SLM 204. The reflected (or transmitted in the general case) radiation is projected as a line segment 203 on a workpiece 201. The data driving the SLM changes as the workpiece is scanned 207 to build up an exposed image. A strongly anamorphic optical system 206 concentrates energy from multiple mirrors in a column (or row) to point in the image and the entire two-dimensional illuminated array forms a narrow line segment 203 that is swept across the workpiece. In one dimension, the anamorphic optics demagnify the illuminated area, for instance, by 2× to 5×, so the a 60 millimeter wide SLM would image onto a line segment 30 to 12 mm long. Along the short dimension, the anamorphic optics strongly demagnify the column of mirrors to focus onto a narrow area such as 3 microns wide, i.e. essentially a single resolved line. Alternatively, the area could be 1 or 5 microns wide or less than 10 microns wide. Focus onto a 3 micron wide area could involve an 80× demagnification, from approximately 240 microns to 3 microns. The anamorphic optical path demagnifies the row of mirrors to an extent that individual mirrors are combined and not resolved at the image plane. As described in related applications, the SLM could be positioned in a plane that is in sharp focus along one dimension of the SLM and de-focused along the other dimension. This would decrease the criticality of the lens system.

A rotor enables many image processing instruments to be used on large flat substrates and scanning at high speed, e.g. on solar panels, display substrates, sheet metal, architectural glass, roll-to-roll plastic, paper, and the like. Through the rotating arms an image may be captured at the periphery and transferred to the hub where a camera or an optical analytical instrument may be situated, e.g. a reflectometer, spectrophotometer, scatterometer, multispectral camera, polarimeter, fluorescence or photo-luminescence instrument. Instruments that are complex, bulky or fragile can be mounted fixed at the hub and still access any point on the surface of, say, a two meter wide thin-film photovoltaic panel passing on a conveyor under the rotor, thereby enabling full-area inspection or analysis at dense grids on large workpieces without removing sheets for analysis or stopping the roll-to-roll flow. The rotor may have only flat optics or it may have reflecting relays in the arms, allowing achromatic use from far IR to deep UV. The illumination, e.g. UV for fluorescence studies, may be brought from the hub or it may be generated within the rotor.

As mentioned above, the disclosed technology enables many instruments to be used on large flat substrates and scanning at high speed, e.g. on solar panels, display substrates, sheet metal, architectural glass, roll-to-roll plastic, paper, and the like. Through the rotating arms an image may be captured at the periphery and transferred to the hub where a camera or detector (e.g., a vidicon, CCD, CID, CMOS device, and/or a TDI, intensified, gated, avalanche, single photon, photon-counting, interferometric, colorimetric, heterdyne, photoconductive or bolometric detector or array) is located, or an optical analytical instrument may be situated, (e.g., a reflectometer, spectrophotometer, colorimeter, scatterometer, multispectral camera, polarimeter, or a fluorescence, photo-luminescence or photoacoustic instrument).

Other possible uses are for optical measurements of heat (infrared emission), color, flatness, smoothness, film thickness, chemical composition, cleanliness, or for verification of pattern integrity or fidelity. The method is particularly beneficial where an image of the surface or an exact location of a found defect or feature is needed. Instruments that are complex, bulky or fragile can be mounted fixed at the hub and still access any point on the surface of, say, a two meter wide thin-film photovoltaic panel passing on a conveyor under the rotor, thereby enabling full-area inspection or analysis at dense grids on large workpieces without removing sheets for analysis or stopping the roll-to-roll flow. The rotor may have only flat optics or it may have reflecting relays in the arms, allowing achromatic use from far IR to deep UV. The illumination (e.g. visible incident light for reflected-light microscopy) may be brought from the hub or it may be generated within the rotor. Several instruments and or writing modes may be combined in one rotor, either by being combined in one optical arm or by employing different ones. At least one instrument or optical image device may emit an exciting beam through an arm and receives an image back from the workpiece, e.g. UV for fluorescence studies. The rotation may be continuous with a constant or varying angular speed or alternatively be driven by in a stop and go fashion, in particular for random-access analysis of workpieces. Focusing of the imaging optics may be fixed, variable from time to time or dynamic during scanning and based on feedback from focus sensors based on interferometry, back-reflection, proximity to a fiber end, optical triangulation, optical defocus or parallax; fluid flow, pressure or viscous resistance; ultrasound time-of-flight or phase; capacitance, inductance or other suitable phenomena indicating a distance or position.

Some Particular Embodiments

The technology disclosed may be practiced as a method or device adapted to practice the method. The technology may be embodied in an article of manufacture such as media impressed with logic to carry out computer-assisted method or program instructions that can be combined with hardware to produce a computer-assisted device.

One embodiment is a method of handling varying pixel overlaps along a first axis as a scanning head sweeps a curved path that is not parallel to the first axis. The pixel clock runs at a varying frequency that varies approximately sinusoidally with a position of a scanning head relative to a first axis, whereby a distance swept along the first axis by the scanning head is essentially equal between ticks of the pixel clock.

In alternate embodiments, one or more pixel values to be written are determined by the scanning head in periods of the pixel clock. Additionally, one or more pixel values read by the scanning head in periods of the pixel clock can also be saved to memory.

One aspect of the technology disclosed, applicable to any of the embodiments above, is moving the scanning head over a workpiece on a rotor arm in a circular motion.

Another aspect of the technology disclosed is moving a workpiece 201 along an axis of movement as the scanning head sweeps a curved path.

In another embodiment, the pixel clock is generated by a direct digital synthesizer. The direct digital synthesizer signals the tick of the pixel clock upon overflow of an accumulator 415. Alternately, the direct digital synthesizer adds varying increments to the accumulator 415 and triggers an overflow at a fixed threshold.

In another embodiment, instead of adding varying increments the direct digital synthesizer adds constant increments to the accumulator 415 and adjusts the overflow threshold upon at least some overflows. This embodiment may, of course, be combined with other aspects of the methods.

One device embodiment is a variable frequency pixel clock that is particularly useful for a rotary scanning system. The variable frequency pixel clock handles pixel spacing along a first axis as a scanning head sweeps a curved path that is not parallel to the first axis. The variable frequency pixel clock includes a pixel clock, a clock signal line coupled to the pixel clock and a rotor position signal line coupled to the pixel clock. The pixel clock synchronizes responsive to the rotor position rotor signal line and generates a varying frequency clock signal that varies approximately sinusoidally with a position of the rotor relative to a first axis, whereby a distance swept along the first axis by the rotor is essentially equal between clock signals.

One aspect of the pixel clock further includes a raster value loader that outputs a plurality of pixel values responsive to each of the clock signals. An alternative aspect includes a raster value memory that stores a plurality of pixel values responsive to each of the clock signals.

In some implementations, the rotor moves a scanning head over a workpiece on a rotor arm in a circular motion.

In combination with any of the aspects are implementations above, pixel clock may be part of the system wherein a workpiece moves along an axis of movement as the scanning head sweeps a curved path.

Any of the pixel clocks above may include a direct digital synthesizer. The direct digital synthesizer may include an accumulator and generate the clock signal upon overflow of the accumulator. In some embodiments, the direct digital synthesizer adds varying increments to the accumulator and triggers an overflow at a fixed threshold. In alternative embodiments, the direct digital synthesizer adds constant increments to the accumulator and adjusts an overflow threshold upon at least some overflows.

While the disclosed technology is disclosed by reference to the preferred embodiments and examples detailed above, it is understood that these examples are intended in an illustrative rather than in a limiting sense. Computer-assisted processing is implicated in the described embodiments, implementations and features. Accordingly, the disclosed technology may be embodied in methods for reading or writing a workpiece 201 using at least one optical arm that sweeps an arc over the workpiece, systems including logic and resources to carry out reading or writing a workpiece using at least one optical arm that sweeps an arc over the workpiece, systems that take advantage of computer-assisted control for reading or writing a workpiece using at least one optical arm that sweeps an arc over the workpiece, media impressed with logic to carry out, data streams impressed with logic to carry out reading or writing a workpiece using at least one optical arm that sweeps an arc over the workpiece, or computer-accessible services that carry out computer-assisted reading or writing a workpiece using at least one optical arm that sweeps an arc over the workpiece. It is contemplated that modifications and combinations will readily occur to those skilled in the art, which modifications and combinations will be within the spirit of the disclosed technology and the scope of the following claims.

I claim as follows:

1. The method of handling varying pixel overlaps along a first axis as a scanning head sweeps a curved path that is not parallel to the first axis, the method including:
    running a pixel clock at a varying frequency that varies approximately sinusoidally with a position of a scanning head relative to a first axis, whereby a distance swept along the first axis by the scanning head is essentially equal between ticks of the pixel clock.

2. The method of claim 1, further including, determining one or more pixel values to be written by the scanning head according to periods of the pixel clock.

3. The method of claim 1, further including saving to memory one or more pixel values read by the scanning head according to periods of the pixel clock.

4. The method of claim 1, further including moving the scanning head over a workpiece on a rotor arm in a circular motion.

5. The method of claim 4, further including moving a workpiece along an axis of movement as the scanning head sweeps a curved path.

6. The method of claim 1, wherein the pixel clock is generated by a direct digital synthesizer.

7. The method of claim 6, wherein the direct digital synthesizer signals of the tick of the pixel clock upon overflow of an accumulator.

8. The method of claim 7, wherein the direct digital synthesizer adds varying increments to the accumulator and triggers an overflow at a fixed threshold.

9. The method of claim 7, wherein the direct digital synthesizer adds constant increments to the accumulator and adjusts the overflow threshold upon at least some overflows.

10. A variable frequency pixel clock for a rotary scanning system that handles pixel spacing along a first axis as a scanning head sweeps a curved path that is not parallel to the first axis, the variable frequency pixel clock including:
- a pixel clock;
- a clock signal line coupled to the pixel clock; and
- a rotor position signal line coupled to the pixel clock;
- wherein the pixel clock synchronizes responsive to the rotor position rotor signal line and generates a varying frequency clock signal that varies approximately sinusoidally with a position of the rotor relative to a first axis, whereby a distance swept along the first axis by the rotor is essentially equal between clock signals.

11. The pixel clock of claim 10, further including a raster value loader that outputs a plurality of pixel values responsive to each of the clock signals.

12. The pixel clock of claim 10, further including a raster value memory that stores a plurality of pixel values responsive to each of the clock signals.

13. The pixel clock of claim 10, wherein the rotor moves a scanning head over a workpiece on a rotor arm in a circular motion.

14. The pixel clock of claim 13, wherein a workpiece moves along an axis of movement as the scanning head sweeps a curved path.

15. The pixel clock of claim 10, wherein the pixel clock includes a direct digital synthesizer.

16. The pixel clock of claim 15, wherein the direct digital synthesizer includes an accumulator and generates the clock signal upon overflow of the accumulator.

17. The pixel clock of claim 16, wherein the direct digital synthesizer adds constant increments to the accumulator and adjusts an overflow threshold upon at least some overflows.

18. The pixel clock of claim 15, wherein the direct digital synthesizer adds varying increments to the accumulator and triggers an overflow at a fixed threshold.

* * * * *